United States Patent
Kim

(10) Patent No.: US 7,217,985 B2
(45) Date of Patent: May 15, 2007

(54) SEMICONDUCTOR DEVICE INCLUDING A TRANSISTOR HAVING LOW THRESHOLD VOLTAGE AND HIGH BREAKDOWN VOLTAGE

(75) Inventor: Myoung-soo Kim, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 3 days.

(21) Appl. No.: 11/066,492

(22) Filed: Feb. 28, 2005

(65) Prior Publication Data
US 2005/0194648 A1  Sep. 8, 2005

(30) Foreign Application Priority Data
Mar. 3, 2004  (KR) .................. 10-2004-0014342

(51) Int. Cl.
*H01L 29/00* (2006.01)
(52) U.S. Cl. .............. 257/500; 257/392; 257/391; 257/E27.064; 438/286; 438/275
(58) Field of Classification Search ........... 438/286, 438/275; 257/500, 369, 391, 392, 350
See application file for complete search history.

(56) References Cited

U.S. PATENT DOCUMENTS

| | | | |
|---|---|---|---|
| 5,480,830 A | 1/1996 | Liao et al. ............ | 437/58 |
| 5,877,531 A * | 3/1999 | Fukatsu et al. ......... | 257/344 |
| 6,413,824 B1 * | 7/2002 | Chatterjee et al. ....... | 438/275 |
| 2003/0008484 A1 * | 1/2003 | Hook ..................... | 438/524 |
| 2003/0042544 A1 * | 3/2003 | Kim ....................... | 257/349 |
| 2004/0150066 A1 * | 8/2004 | Inoue et al. ............. | 257/500 |

FOREIGN PATENT DOCUMENTS

| | | |
|---|---|---|
| JP | 02-021653 | 1/1990 |
| JP | 11-054630 | 2/1999 |
| JP | 2000-311950 | 11/2000 |
| KR | 10-1994-0039479 | 7/1996 |
| KR | 10 2003 0086836 | 11/2003 |

* cited by examiner

*Primary Examiner*—Jerome Jackson
*Assistant Examiner*—Paul Budd
(74) *Attorney, Agent, or Firm*—Lee & Morse, P.C.

(57) ABSTRACT

A semiconductor device, including a transistor having low threshold voltage and high breakdown voltage, includes a first gate electrode, a second gate electrode, and a third gate electrode arranged on a predetermined first, second, and third region of a semiconductor substrate, respectively, a first gate insulating layer, a second gate insulating layer, and a third gate insulating layer, which are interposed between the first, second and third gate electrode and the semiconductor substrate, respectively, and first, second, and third junction regions arranged in the first, second, and third region of the semiconductor substrate, respectively, on both sides of the first, second and third gate electrode, respectively, wherein a thickness of the first gate insulating layer is greater than a thickness of either of the second or third gate insulating layers, and wherein a structure of the first junction region and a structure of the third junction region are the same.

23 Claims, 4 Drawing Sheets

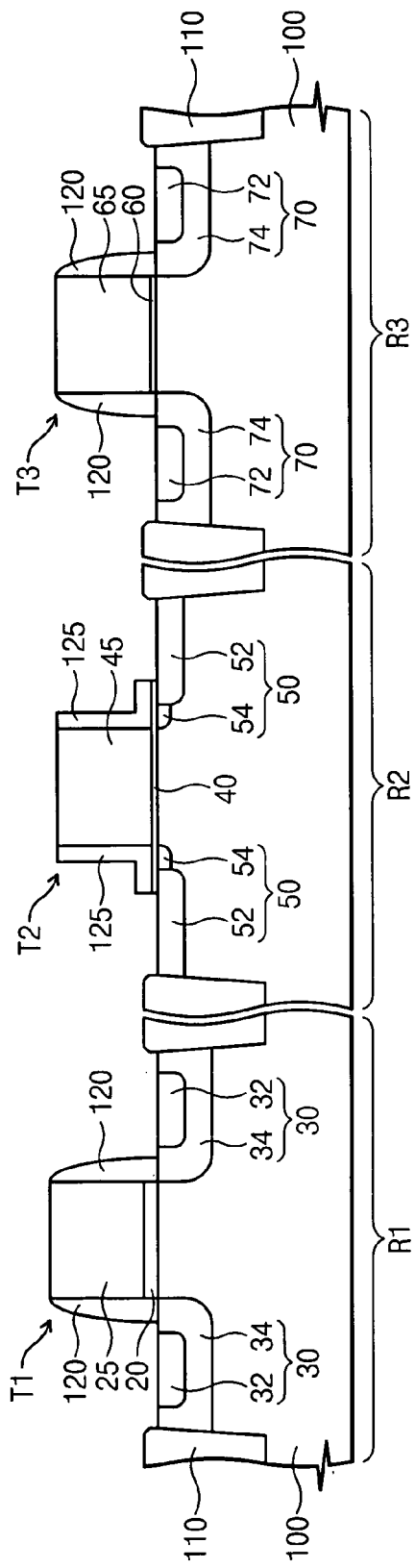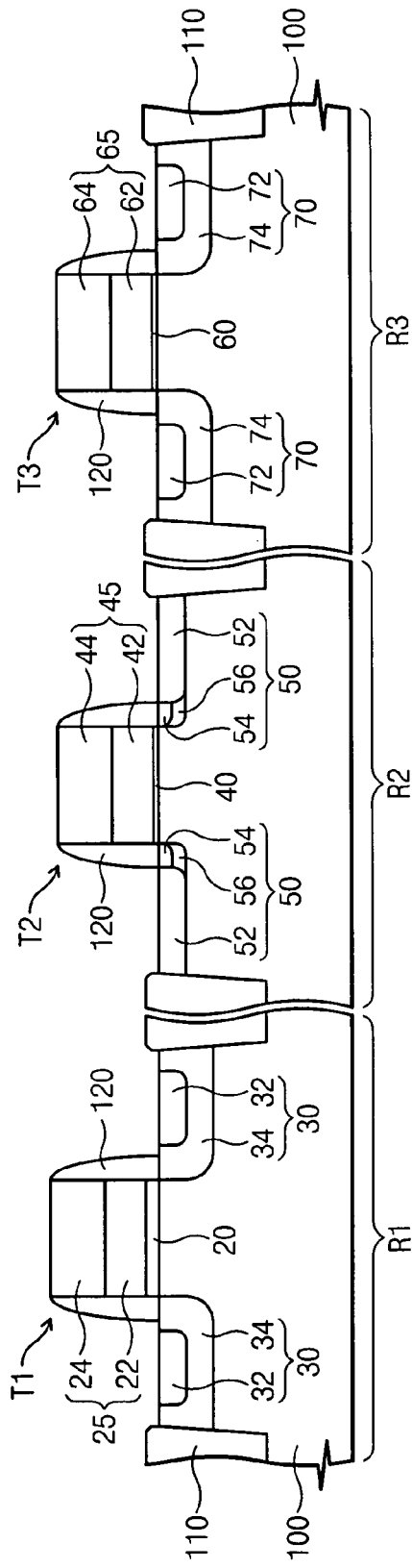

SEMICONDUCTOR DEVICE INCLUDING A TRANSISTOR HAVING LOW THRESHOLD VOLTAGE AND HIGH BREAKDOWN VOLTAGE

BACKGROUND OF THE INVENTION

1. Field of the Invention

The present invention generally relates to a semiconductor device. More specifically, the present invention relates to a semiconductor device including a transistor having a low threshold voltage and a high breakdown voltage.

2. Description of the Related Art

Various electronic devices such as computers, telecommunication devices, electric home appliances and so forth include integrated circuits formed of electronic components such as transistors, resistors, capacitors and inductors in order to perform specific functions. With an increasing demand for multiple and high functionality in the field of electronic devices, there is a tendency that electronic components used in integrated circuits become multi-functional and more complex.

However, kinds of electronic components used in semiconductor devices are limited due to an overall process characteristic of semiconductor fabricating processes. In other words, unlike a mode for individually assembling parts formed as occasion demands, e.g., in the production of an automobile, electronic components used in a semiconductor device are fabricated collectively through a series of processes. As a result, in order to form various kinds of electronic components, there is a need to increase the number of fabricating process steps. However, because of a disadvantage associated with increasing fabrication costs and a defect rate, it is necessary to limit a kind of electronic component used in semiconductor devices.

Transistors determinately influence characteristics such as size, speed, usable time, and power dissipation. For example, ordinary advanced semiconductor devices, e.g., a LCR driver IC (LDI), include a high-voltage transistor having a high breakdown voltage characteristic and a low-voltage transistor having a low threshold voltage characteristic.

However, the high-voltage transistor is weak as compared with the low-voltage transistor with regard to performance of transistors. The reason for this weakness is that the resistance between a source/drain of the high-voltage transistor is high in a turn-on state. In addition, due to a wide dispersion of a threshold voltage by a thick gate insulating layer, the high-voltage transistor has technical difficulties in the areas of a matching property or a mixed signal property. The low-voltage transistor has an excellent performance characteristic, as well as a narrow dispersion of a threshold voltage, but has a low breakdown voltage. As a result, the low-voltage transistor is not used in the field of circuits where a high voltage is applied. For electronic devices requiring excellent and varied functions, a new transistor, which has a narrow dispersion of a threshold voltage and is suitable for use in the field of circuits where a high voltage is applied, is required. However, the structure of such a new transistor should have a processing compatibility with low-voltage and high-voltage transistors to avoid increasing fabrication costs and a defect rate.

SUMMARY OF THE INVENTION

The present invention is therefore directed to a semiconductor device including a transistor having low threshold voltage and high breakdown voltage, which substantially overcomes one or more of the problems due to the limitations and disadvantages of the related art.

It is a feature of an embodiment of the present invention to provide a transistor having a narrow threshold voltage that is suitable for use in a circuit for receiving a high-voltage.

It is another feature of an embodiment of the present invention to provide a transistor having a high breakdown voltage and low threshold voltage, and a process compatibility structure between low-voltage and high-voltage transistors.

At least one of the above and other features and advantages of the present invention may be realized by providing a semiconductor device including a first gate electrode, a second gate electrode, and a third gate electrode arranged on a predetermined first, second, and third region of a semiconductor substrate, respectively, a first gate insulating layer, a second gate insulating layer, and a third gate insulating layer, which are interposed between the first, second and third gate electrode and the semiconductor substrate, respectively, and first, second, and third junction regions arranged in the first, second, and third region of the semiconductor substrate, respectively, on both sides of the first, second and third gate electrode, respectively, wherein a thickness of the first gate insulating layer is greater than a thickness of either of the second or third gate insulating layers, and wherein a structure of the first junction region and a structure of the third junction region are the same.

A thickness of the second gate insulating layer and a thickness of the third insulating layer may be the same.

The first junction region may include a first lightly doped region and a first heavily doped region, and the third junction region may include a third lightly doped region and a third heavily doped region, wherein a depth of the first lightly doped region is greater than a depth of the first heavily doped region, and wherein a depth of the third lightly doped region is greater than a depth of the third heavily doped region.

A depth, an impurity concentration and a kind of an impurity contained therein of the first lightly doped region may be the same as a depth, an impurity concentration and a kind of an impurity contained therein of the third lightly doped region, and a depth, an impurity concentration and a kind of an impurity contained therein of the first heavily doped region may be the same as a depth, an impurity concentration and a kind of an impurity contained therein of the third heavily doped region.

The first lightly doped region may cover a bottom surface and a lateral surface of the first heavily doped region, and the third lightly doped region may cover a bottom surface and a lateral surface of the third heavily doped region. The first lightly doped region may cover a lateral surface of the first heavily doped region, and the third lightly doped region may cover a lateral surface of the third heavily doped region.

The first junction region may further include a first low impurity region covering a bottom surface of the first heavily doped region, and the third junction region may further include a third low impurity region covering a bottom surface of the third heavily doped region.

The semiconductor device may further include a first insulating pattern interposed between the first lightly doped regions and the first gate electrode, and a third insulating pattern interposed between the third lightly doped regions and the third gate electrode, wherein a thickness of the first and third insulating patterns are greater than a thickness of the first gate insulating layer and the third gate insulating layer, respectively.

The second junction region may include a second lightly doped region and a second heavily doped region, wherein a depth of the second lightly doped region is less than a depth of the second heavily doped region. The second lightly doped region may cover an upper lateral surface of the second heavily doped region. The second junction region may further include a halo region under the second lightly doped region, the halo region covering a lower lateral surface of the second heavily doped region.

The semiconductor may further include first gate spacers on both sidewalls of the first gate electrode, second gate spacers on both sidewalls of the second gate electrode, and third gate spacers on both sidewalls of the third gate electrode. The second gate spacers may be L-shaped and have a horizontal projection extending away from the second gate electrode.

The first, second and third gate insulating layers may be formed of at least one selected from the group consisting of a silicon oxide layer, a silicon oxynitride layer, a silicon nitride layer, an aluminum oxide layer, a zirconium oxide layer, and a hafnium oxide layer.

A material forming the first, second and third gate electrodes may be the same kind of material and a thickness of each of the first, second and third gate electrodes may be the same.

The first, second and third gate electrodes may be formed of at least one selected from the group consisting of polysilicon, tantalum, tantalum nitride, zirconium, hafnium, platinum, ruthenium, ruthenium oxide, iridium, tungsten, polycide, tungsten silicide, and cobalt silicide.

At least one of the above and other features and advantages of the present invention may be realized by providing a semiconductor device including a first gate electrode, a second gate electrode, and a third gate electrode arranged on a predetermined first, second, and third region of a semiconductor substrate, respectively, a first gate insulating layer interposed between the first gate electrode and the semiconductor substrate, a second gate insulating layer, which has a thickness less than a thickness of the first gate insulating layer, interposed between the second gate electrode and the semiconductor substrate, a third gate insulating layer, which has a thickness the same as the thickness of the second gate insulating layer, interposed between the third gate electrode and the semiconductor substrate, first heavily doped regions formed in the first region of the semiconductor substrate on both sides of the first gate electrode and first lightly doped regions enclosing the first heavily doped regions, second heavily doped regions formed in the second region of the semiconductor substrate on both sides of the second gate electrode and second lightly doped regions covering an upper lateral surface of the second heavily doped region, and third heavily doped regions formed in the third region of the semiconductor substrate on both sides of the third gate electrode and third lightly doped regions enclosing the third heavily doped regions, wherein a depth, an impurity concentration, and a kind of an impurity contained therein of the first heavily doped region and the first lightly doped region and a depth, an impurity concentration, and a kind of an impurity contained therein of the third heavily doped region and the third lightly doped region, respectively, are the same.

The semiconductor device may further include a halo region under the second lightly doped region and covering a lower lateral surface of the second heavily doped region.

At least one of the above and other features and advantages of the present invention may be realized by providing a semiconductor device including a first gate electrode, a second gate electrode, and a third gate electrode arranged on a predetermined first, second, and third region of a semiconductor substrate, respectively, a first gate insulating layer interposed between the first gate electrode and the semiconductor substrate, a second gate insulating layer, which has a thickness less than a thickness of the first gate insulating layer, interposed between the second gate electrode and semiconductor substrate, a third gate insulating layer, which has a thickness the same as the thickness of the second gate insulating layer, interposed between the third gate electrode and the semiconductor substrate, first heavily doped regions formed in the first region of the semiconductor substrate on both sides of the first gate electrode, and first lightly doped regions and first low impurity regions, which respectively cover a lateral surface and a bottom surface of the first heavily doped regions, second heavily doped regions formed in the second region of the semiconductor substrate on both sides of the second gate electrode and second lightly doped regions covering an upper lateral surface of the second heavily doped region, and third heavily doped regions formed in the third region of the semiconductor substrate on both sides of the third gate electrode, and third lightly doped regions and third low impurity regions, which respectively cover a lateral surface and a bottom surface of the third heavily doped regions, wherein a depth, an impurity concentration, and a kind of an impurity contained therein of the first lightly doped region, the first heavily doped region, and the first low impurity region and a depth, an impurity concentration, and a kind of an impurity contained therein of the third lightly doped region, the third heavily doped region, and the third low impurity region, respectively, are the same.

The semiconductor device may further include a halo region under the second lightly doped regions and covering a lower lateral surface of the second heavily doped region.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 1 through 7 illustrate sectional views of various embodiments of a semiconductor substrate including a transistor in accordance with the present invention.

DETAILED DESCRIPTION OF THE INVENTION

Figure 1:
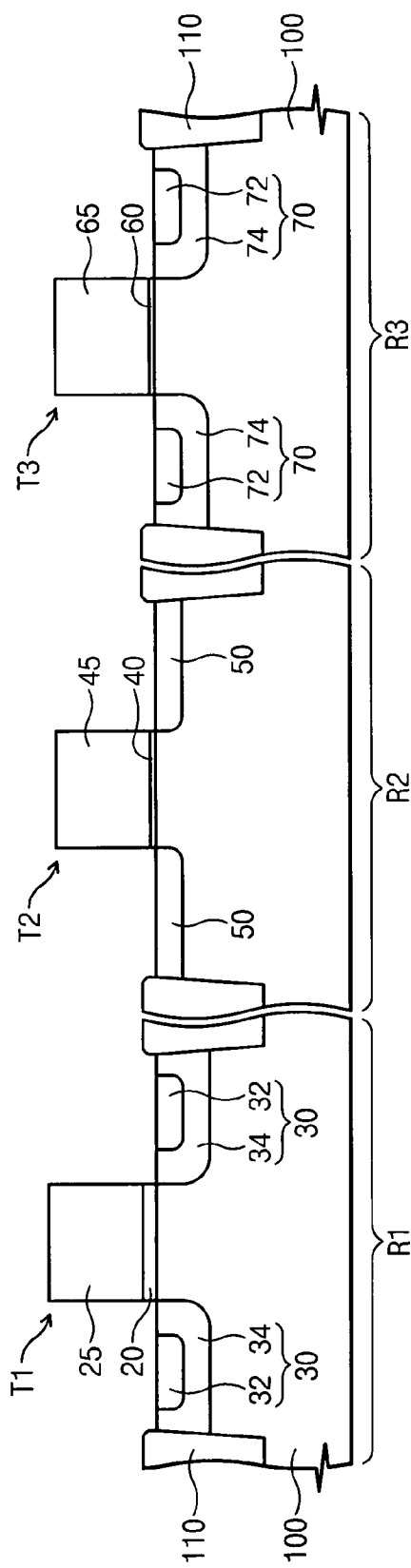

Korean Patent Application No. 2004-14342, filed on Mar. 3, 2004, in the Korean Intellectual Property Office, and entitled: "Semiconductor Device Having Transistor with Low Threshold Voltage and High Breakdown Voltage," is incorporated by reference herein in its entirety.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawing figures, the dimensions of layers and regions are exaggerated for clarity of illustration. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Similarly, it will be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present. Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals and characters refer to like elements throughout the specification and drawing figures.

FIGS. 1 through 7 illustrate sectional views of various embodiments of a semiconductor substrate including a transistor in accordance with the present invention.

Referring to FIG. 1, a device isolation layer 110 defining a first region R1, a second region R2, and a third region R3 is formed in a predetermined region of a semiconductor substrate 100. A first transistor T1, a second transistor T2, and a third transistor T3 are arranged at the first region R1, the second region R2, and the third region R3, respectively.

The first transistor T1 includes a first gate electrode 25, a first gate insulating layer 20 and first junction regions 30, which are formed in the first region R1. The first gate electrode 25 is arranged over the first region R1 of the semiconductor substrate. The first gate insulating layer 20 is interposed between the first gate electrode 25 and the semiconductor substrate 100. The first junction regions 30 are formed in the semiconductor substrate 100 on both sides of the first gate electrode 25.

The second transistor T2 includes a second gate electrode 45, a second gate insulating layer 40, and second junction regions 50, which are formed in the second region R2. The second gate electrode 45 is arranged over the second region R2 of the semiconductor substrate 100. The second gate insulating layer 40 is interposed between the second gate electrode 45 and the semiconductor substrate 100. The second junction regions 50 are formed in the semiconductor substrate 100 on both sides of the second gate electrode 45.

The third transistor T3 includes a third gate electrode 65, a third gate insulating layer 60 and third junction regions 70, which are formed in the third region R3. The third gate electrode 65 is arranged over the third region R3 of the semiconductor substrate 100. The third gate insulating layer 60 is interposed between the third gate electrode 65 and the semiconductor substrate 100. The third junction regions 70 are formed in the semiconductor substrate 100 on both sides of the third gate electrode 65.

The first gate insulating layer 20 is thicker than the second gate insulating layer 40 and the third gate insulating layer 60. For example, a thickness of the first gate insulating layer 20 may be from about 100 Å to about 2000 Å, and a thickness of the second and third gate insulating layers 40 and 60 may be from about 10 Å to about 200 Å. The second gate insulating layer 40 and the third gate insulating layer 60 may preferably be formed with the same kind of material and have a same thickness. Accordingly, the second and third transistors T2 and T3 have a lower threshold voltage and a narrower threshold voltage dispersion than the first transistor T1. The first, second and third gate insulating layers 20, 40 and 60 may preferably be formed of a silicon oxide layer. In addition, the first, second and third gate insulating layers 20, 40 and 60 may be formed of at least one selected from the group consisting of a silicon oxide layer, a silicon oxynitride layer, a silicon nitride layer, an aluminum oxide layer, a zirconium oxide layer, a hafnium oxide layer and other high-k dielectric layers.

The first, second and third gate electrodes 25, 45 and 65 may be conductive patterns, which are formed using the same process steps at the same time. In this case, the first, second and third gate electrodes 25, 45 and 65 may be formed with the same kind of material and have the same thickness. The first, second and third gate electrodes 25, 45 and 65 may preferably be formed of at least one selected from the group consisting of polysilicon, tantalum, tantalum nitride, zirconium, hafnium, platinum, ruthenium, ruthenium oxide, iridium, tungsten, polycide, tungsten silicide and cobalt silicide.

The first junction region 30 includes a first lightly doped region 34 and a first heavily doped region 32. The third junction region 70 includes a third lightly doped region 74 and a third heavily doped region 72. A structure of the first junction region 30 and a structure of the third junction region 70 are the same. More specifically, a depth, an impurity concentration and a kind of impurity contained therein of the first lightly doped region 34 and the first heavily doped region 32 are the same as a depth, an impurity concentration and a kind of impurity contained therein of the third lightly doped region 74 and the third heavily doped region 72. (Here or hereinafter, the expression "the same" on a quantitative magnitude, such as depth and concentration, means that compared quantities are the same within an error limit of about 10%, i.e., "about the same." In addition, components expressed by "the same" may be formed together during the same process step.) The first and third lightly doped regions 34 and 74, and the first and third heavily doped regions 32 and 72 include an impurity of a different conductivity type from each other. Further, the first and third heavily doped regions 32 and 72 have a higher impurity concentration than the first and third lightly doped regions 34 and 74.

Moreover, the first and third lightly doped regions 34 and 74 are different from the second junction region 50 in that they are deeper than the first and third heavily doped regions 32 and 72. In one embodiment of the present invention, the first and third lightly doped regions 34 and 74 form a Double Diffused Drain (DDD) structure covering a bottom surface and a lateral surface of the first and third heavily doped regions 32 and 72, respectively, as shown in FIGS. 1 through 5. Accordingly, the first and third transistors may have a high breakdown voltage.

The above-mentioned embodiment may be modified variously, as shown in FIGS. 2 through 7. These modified embodiments will be more fully described with reference to FIGS. 2 through 7. However, in order to avoid duplication of explanation, descriptions of the elements common to the embodiment of FIG. 1 will not be repeated.

Figure 2:
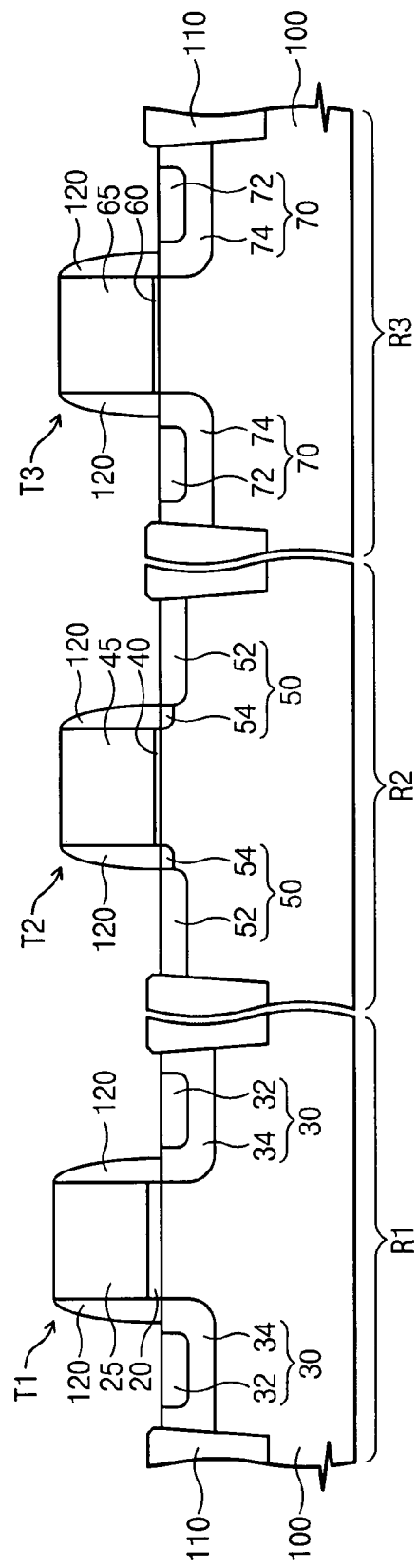

In one alternative embodiment, shown in FIGS. 2 and 3, each of the second junction regions 50 may include a second heavily doped region 52 and a second lightly doped region 54 covering an upper lateral surface of the second heavily doped region 52. That is, the second junction region 50 includes a junction region referred to as a Lightly Doped Drain (LDD). In this case, the second lightly doped region 54 is shallower than the second heavily doped region 52. Accordingly, the second junction region 50 differs from the first and third junction regions 30 and 70 in which lightly doped regions 34 and 74 are deeper than the heavily doped regions 32 and 72.

In another embodiment of the present invention, the second junction region 50 may further include a halo region 56 arranged under the second lightly doped region 54, as shown in FIGS. 4 through 7. The halo region 56 covers a bottom lateral surface of the second heavily doped region 52. Therefore, it is possible to minimize punch-through of the second transistor T2 that is generated by an excessive diffusion of a depletion layer in the semiconductor substrate 100 between the second heavily doped regions 52. The halo region 56 includes an impurity having the same conductivity type as the semiconductor substrate 100. Additionally, the second lightly doped region 54 and the second heavily doped region 52 include an impurity having a different conductivity type from the semiconductor substrate 100. More specifically, the second heavily doped region 52 has a higher impurity concentration than the second lightly doped region 54.

Figure 5:
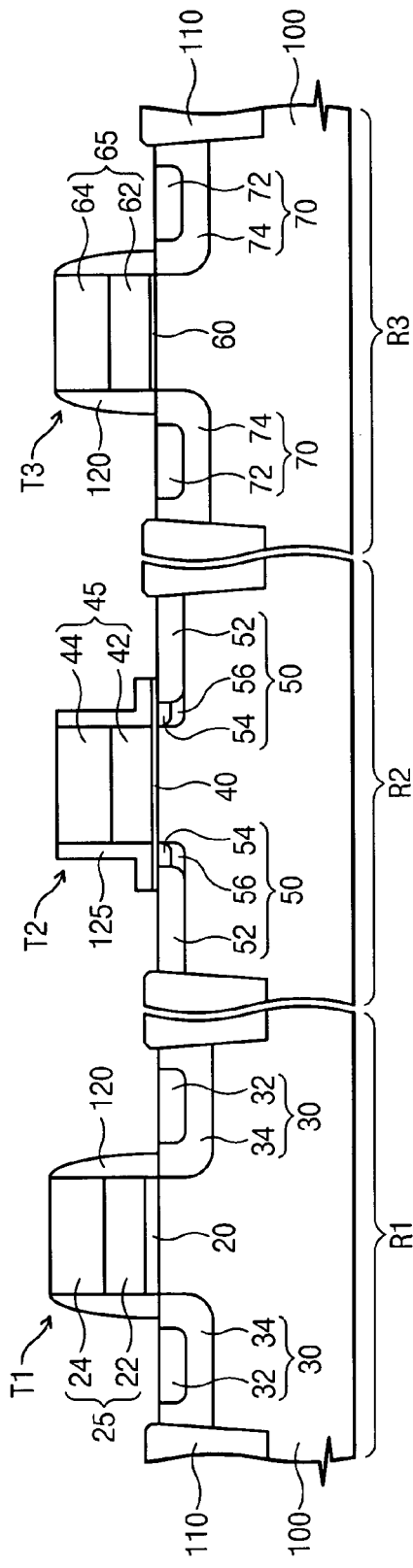
Figure 6:
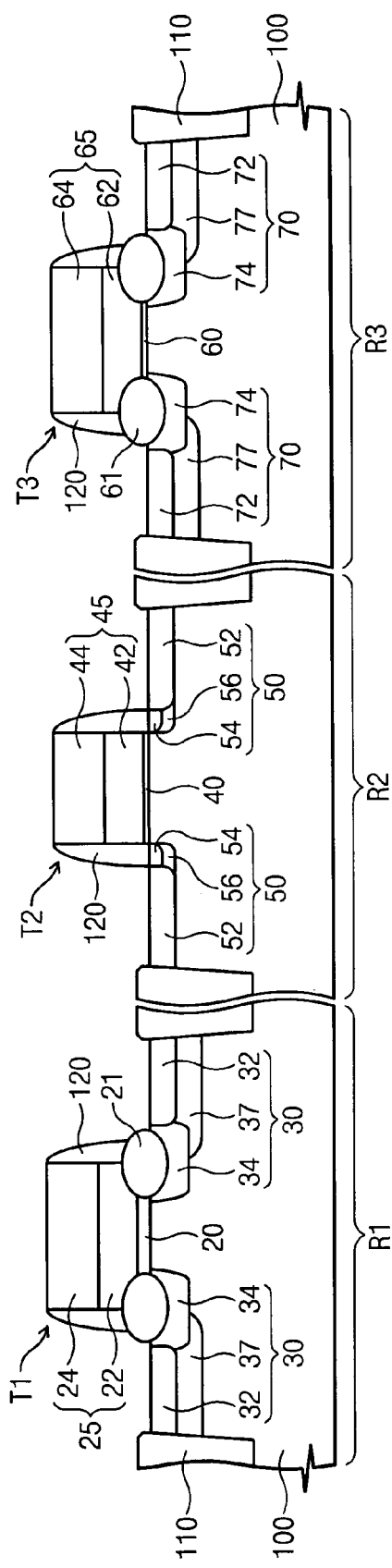
Figure 7:
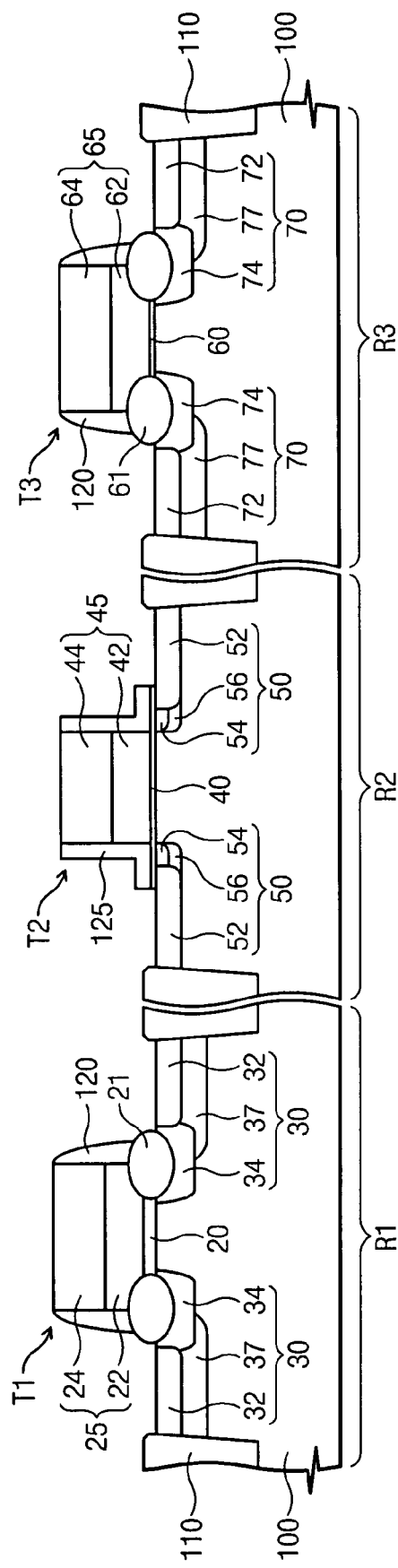

An embodiment of the present invention may further include gate spacers 120 having a conventional spacer shape arranged on both sidewalls of the first, second and third gate electrodes 25, 45 and 65, as shown in FIGS. 2, 4 and 6. Alternatively, gate spacers 120 having a conventional spacer shape may be arranged on both sidewalls of the first and third gate electrodes 25 and 65, and gate spacers 125 having an L-shape may be arranged on both sidewalls of the second gate electrode 45, as shown in FIGS. 3, 5 and 7. The L-shaped gate spacers 125 have a horizontal projection that extends away from the second gate electrode 45.

In another alternative embodiment of the present invention, the first, second and third gate electrodes 25, 45 and 65 may include of a sequentially stacked structure of first, second and third lower gate electrodes 22, 42 and 62, and first, second and third upper gate electrodes 24, 44 and 64, respectively, as shown in FIGS. 4 through 7. At this time, the first, second and third lower gate electrodes 22, 42 and 62 may be formed of polysilicon, and the first, second and third upper gate electrodes 24, 44 and 64 may be formed of a material having higher conductivity than the first, second and third lower gate electrodes 22, 42 and 62. In addition, the first, second and third gate electrodes 20, 40 and 60 may be formed of another material according to a conductivity type of the transistor.

By way of further alternative, the first and third lightly doped regions 34 and 74 may have a structure covering the first and third heavily doped regions 32 and 72 in the first and third junction regions 30 and 70, respectively, as shown in FIGS. 6 and 7. This structure is different from the embodiments explained in connection with FIGS. 1 through 5 in that the first and third lightly doped regions 34 and 74 cover all bottom surfaces and lateral surfaces of the first and third heavily doped regions 32 and 72, respectively. In embodiments shown in FIGS. 6 and 7, the first and third lightly doped regions 34 and 74 are adjacent to the semiconductor substrate 100 under the gate electrodes 25, 45 and 65, i.e., the channel regions. More specifically, the first and third lightly doped regions 34 and 74 are arranged between the first and third heavily doped regions 32 and 72, and the channel region, respectively.

In yet another alternative embodiment, a first low impurity region 37 and a third low impurity region 77 may be arranged under the first and third heavily doped regions 32 and 72, respectively, as shown in FIGS. 6 and 7. Resultantly, the first lightly doped region 34 and the first low impurity region 37 are interposed between the first heavily doped region 32 and the semiconductor substrate 100. The third heavily doped region 74 and the third low impurity region 77 are interposed between the third heavily doped region 72 and the semiconductor substrate 100. The first and third low impurity regions 37 and 77 have an impurity concentration lower than the first and third heavily doped regions 32 and 72. A depth, an impurity concentration and a kind of an impurity contained therein of the first low impurity region 37 is the same as a depth, an impurity concentration and a kind of an impurity contained therein of the third low impurity region 77. Accordingly, the first and third junction regions 30 and 70 form a modified DDD (Double Diffused Drain) structure.

In yet still another alternative embodiment, as shown in FIGS. 6 and 7, a first insulating pattern 21 and a third insulating pattern 61 may be arranged over the first and third lightly doped regions 34 and 74, respectively. The first and third insulating patterns 21 and 61 are thicker than the first and third gate insulating layers 20 and 60. In accordance with another embodiment (not shown), the first and third insulating patterns 21 and 61 may be formed having the same thickness and of the same material as the device isolation layer 110. Due to the first and third insulating patterns 21 and 61, a voltage applied between the first gate electrode 25 and the first junction region 30, and the third gate electrode 65 and the third junction region 70 can be increased sufficiently.

According to the present invention, there is provided to a semiconductor device having a high-voltage transistor, a low-voltage transistor and a new transistor at the same time. The high-voltage transistor has a thick gate insulating layer and junction regions having a DDD structure. The low-voltage transistor has a thin gate insulating layer and junction regions having a LDD structure. The new transistor has a thin gate insulating layer and junction regions having a DDD structure. The new transistor has junction regions that will not breakdown at a high voltage and, at the same time, a low threshold voltage and a narrow threshold voltage profile. Accordingly, the new transistor can be used in a circuit where a high voltage is applied to the source/drain and can still exhibit excellent performance characteristics. Furthermore, since the structure of the new transistor is not completely different from that of the low-voltage transistor and the high-voltage transistor, it can be fabricated without excessively increasing process steps. In other words, the new transistor can be fabricated with a structure having process compatibility. As a result, a semiconductor device having excellent performance can be produced without increasing manufacturing costs.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
    a first gate electrode, a second gate electrode, and a third gate electrode arranged on a predetermined first, second, and third region of a semiconductor substrate, respectively;
    a first gate insulating layer, a second gate insulating layer, and a third gate insulating layer, which are interposed between the first, second and third gate electrode and the semiconductor substrate, respectively; and first, second, and third junction regions arranged in the first, second, and third region of the semiconductor substrate, respectively, on both sides of the first, second and third gate electrode, respectively, wherein the first, second and third junction regions are of a same conductivity type, wherein a thickness of the first gate insulating layer is greater than a thickness of either of the second or third gate insulating layers, and wherein a structure of the first junction region and a structure of the third junction region are the same.

2. The semiconductor device as claimed in claim 1, wherein a thickness of the second gate insulating layer and a thickness of the third insulating layer are the same.

3. The semiconductor device as claimed in claim 1, wherein the first junction region comprises a first lightly doped region and a first heavily doped region, and the third junction region includes a third lightly doped region and a third heavily doped region, wherein a depth of the first lightly doped region is greater than a depth of the first heavily doped region, and wherein a depth of the third lightly doped region is greater than a depth of the third heavily doped region.

4. The semiconductor device as claimed in claim 3, wherein a depth, an impurity concentration and a kind of an impurity contained therein of the first lightly doped region is the same as a depth, an impurity concentration and a kind of an impurity contained therein of the third lightly doped region, and wherein a depth, an impurity concentration and a kind of an impurity contained therein of the first heavily doped region is the same as a depth, an impurity concentration and a kind of an impurity contained therein of the third heavily doped region.

5. The semiconductor device as claimed in claim 3, wherein the first lightly doped region covers a bottom surface and a lateral surface of the first heavily doped region, and wherein the third lightly doped region covers a bottom surface and a lateral surface of the third heavily doped region.

6. The semiconductor device as claimed in claim 3, wherein the first lightly doped region covers a lateral surface of the first heavily doped region, and wherein the third lightly doped region covers a lateral surface of the third heavily doped region.

7. The semiconductor device as claimed in claim 6, wherein the first junction region further comprises a first low impurity region covering a bottom surface of the first heavily doped region, and wherein the third junction region further includes a third low impurity region covering a bottom surface of the third heavily doped region.

8. The semiconductor device as claimed in claim 6, further comprising:

a first insulating pattern interposed between the first lightly doped regions and the first gate electrode; and a third insulating pattern interposed between the third lightly doped regions and the third gate electrode, wherein a thickness of the first and third insulating patterns are greater than a thickness of the first gate insulating layer and the third gate insulating layer, respectively.

9. The semiconductor device as claimed in claim 1, wherein the second junction region comprises a second lightly doped region and a second heavily doped region, wherein a depth of the second lightly doped region is less than a depth of the second heavily doped region.

10. The semiconductor device as claimed in claim 9, wherein the second lightly doped region covers an upper lateral surface of the second heavily doped region.

11. The semiconductor device as claimed in claim 10, wherein the second junction region further comprises a halo region under the second lightly doped region, the halo region covering a lower lateral surface of the second heavily doped region.

12. The semiconductor device as claimed in claim 1, further comprising:

first gate spacers on both sidewalls of the first gate electrode;

second gate spacers on both sidewalls of the second gate electrode; and third gate spacers on both sidewalls of the third gate electrode.

13. The semiconductor device as claimed in claim 12, wherein the second gate spacers are L-shaped and have a horizontal projection extending away from the second gate electrode.

14. The semiconductor device as claimed in claim 1, wherein the first, second and third gate insulating layers are formed of at least one selected from the group consisting of a silicon oxide layer, a silicon oxynitride layer, a silicon nitride layer, an aluminum oxide layer, a zirconium oxide layer, and a hafnium oxide layer.

15. The semiconductor device as claimed in claim 1, wherein a material forming the first, second and third gate electrodes is the same kind of material and a thickness of each of the first, second and third gate electrodes is the same.

16. The semiconductor device as claimed in claim 1, wherein the first, second and third gate electrodes are formed of at least one selected from the group consisting of polysilicon, tantalum, tantalum nitride, zirconium, hafnium, platinum, ruthenium, ruthenium oxide, iridium, tungsten, polycide, tungsten silicide, and cobalt silicide.

17. The semiconductor device as claimed in claim 1, wherein the first, second, and third junction regions are symmetric with respect to the first, second and third gate electrodes, respectively.

18. A semiconductor device, comprising:

a first gate electrode, a second gate electrode, and a third gate electrode arranged on a predetermined first, second, and third region of a semiconductor substrate, respectively;

a first gate insulating layer interposed between the first gate electrode and the semiconductor substrate;

a second gate insulating layer, which has a thickness less than a thickness of the first gate insulating layer, interposed between the second gate electrode and the semiconductor substrate;

a third gate insulating layer, which has a thickness the same as the thickness of the second gate insulating layer, interposed between the third gate electrode and the semiconductor substrate;

first heavily doped regions formed in the first region of the semiconductor substrate on both sides of the first gate electrode and first lightly doped regions enclosing the first heavily doped regions;

second heavily doped regions formed in the second region of the semiconductor substrate on both sides of the second gate electrode and second lightly doped regions covering an upper lateral surface of the second heavily doped region; and third heavily doped regions formed in the third region of the semiconductor substrate on both sides of the third gate electrode and third lightly doped regions enclosing the third heavily doped regions, wherein the first, second and third heavily doped regions are of a first conductivity type, and the first, second and third lightly doped regions are of a second conductivity type, and wherein a depth, an impurity concentration, and a kind of an impurity contained therein of the first heavily doped region and the first lightly doped region and a depth, an impurity concentration, and a kind of an impurity contained therein of the third heavily doped region and the third lightly doped region, respectively, are the same.

19. The semiconductor device as claimed in claim 18, further comprising a halo region under the second lightly doped region and covering a lower lateral surface of the second heavily doped region.

20. The semiconductor device as claimed in claim 18, wherein the first, second and third heavily doped regions are symmetric with respect to the first, second and third gate electrodes, respectively.

21. A semiconductor device, comprising:
a first gate electrode, a second gate electrode, and a third gate electrode arranged on a predetermined first, second, and third region of a semiconductor substrate, respectively;
a first gate insulating layer interposed between the first gate electrode and the semiconductor substrate;
a second gate insulating layer, which has a thickness less than a thickness of the first gate insulating layer, interposed between the second gate electrode and semiconductor substrate;
a third gate insulating layer, which has a thickness the same as the thickness of the second gate insulating layer, interposed between the third gate electrode and the semiconductor substrate;

first heavily doped regions formed in the first region of the semiconductor substrate on both sides of the first gate electrode, and first lightly doped regions and first low impurity regions, which respectively cover a lateral surface and a bottom surface of the first heavily doped regions;

second heavily doped regions formed in the second region of the semiconductor substrate on both sides of the second gate electrode and second lightly doped regions covering an upper lateral surface of the second heavily doped region; and third heavily doped regions formed in the third region of the semiconductor substrate on both sides of the third gate electrode, and third lightly doped regions and third low impurity regions, which respectively cover a lateral surface and a bottom surface of the third heavily doped regions, wherein the first, second and third heavily doped regions are of a first conductivity type, and the first, second and third lightly doped regions are of a second conductivity type, and wherein a depth, an impurity concentration, and a kind of an impurity contained therein of the first lightly doped region, the first heavily doped region, and the first low impurity region and a depth, an impurity concentration, and a kind of an impurity contained therein of the third lightly doped region, the third heavily doped region, and the third low impurity region, respectively, are the same.

22. The semiconductor device as claimed in claim 21, further comprising a halo region under the second lightly doped regions and covering a lower lateral surface of the second heavily doped region.

23. The semiconductor device as claimed in claim 21, wherein the first, second and third heavily doped regions are symmetric with respect to the first, second and third gate electrodes, respectively.

* * * * *